United States Patent [19]

Maruyama

[11] Patent Number: 5,018,108
[45] Date of Patent: May 21, 1991

[54] NONVOLATILE SEMICONDUCTOR MEMORY

[75] Inventor: Tadashi Maruyama, Yokohama, Japan

[73] Assignee: Kabushiki Kaisha Toshiba, Kawasaki, Japan

[21] Appl. No.: 362,180

[22] Filed: Jun. 6, 1989

[30] Foreign Application Priority Data

Jun. 9, 1988 [JP] Japan ............................... 63-142051

[51] Int. Cl.$^5$ ..................... G11C 7/00; G11C 16/06
[52] U.S. Cl. ............................... 365/230.06; 365/185
[58] Field of Search ............... 365/189.06, 185, 230.06

[56] References Cited

U.S. PATENT DOCUMENTS

| | | | |
|---|---|---|---|
| 3,387,286 | 6/1968 | Dennard | 365/150 |
| 3,457,435 | 7/1969 | Burns et al. | 307/251 |
| 4,523,301 | 6/1985 | Kadota et al. | 365/154 |
| 4,598,390 | 7/1986 | Chan | 365/189.06 |

OTHER PUBLICATIONS

Sumito Tanaka and Mitsuaki Ishikawa, "One-Dimensional Writing Model of n-Channel Floating Gate Ionization-Injection MOS (FIMOS)", IEEE Transactions on Electron Devices, vol. ED-28; No. 10, Oct. 1981 pp. 1190-1197.

Primary Examiner—James W. Moffitt
Attorney, Agent, or Firm—Finnegan, Henderson, Farabow, Garrett, and Dunner

[57] ABSTRACT

A memory cell array includes a matrix array of a plurality of memory cells. These memory cells are nonvolatile transistors. The memory cells which are arrayed in each row of the memory array, are coupled with a plurality of word lines. The word lines are selected by a row decoder made up of a plurality of partial decoders. In this case, a constant voltage output circuit, which is provided at the outputs of the partial decoders of the row decoder, outputs a constant voltage lower than a power source voltage to a corresponding word line of those word lines when the corresponding word line is selected by the outputs of the partial decoders.

8 Claims, 6 Drawing Sheets

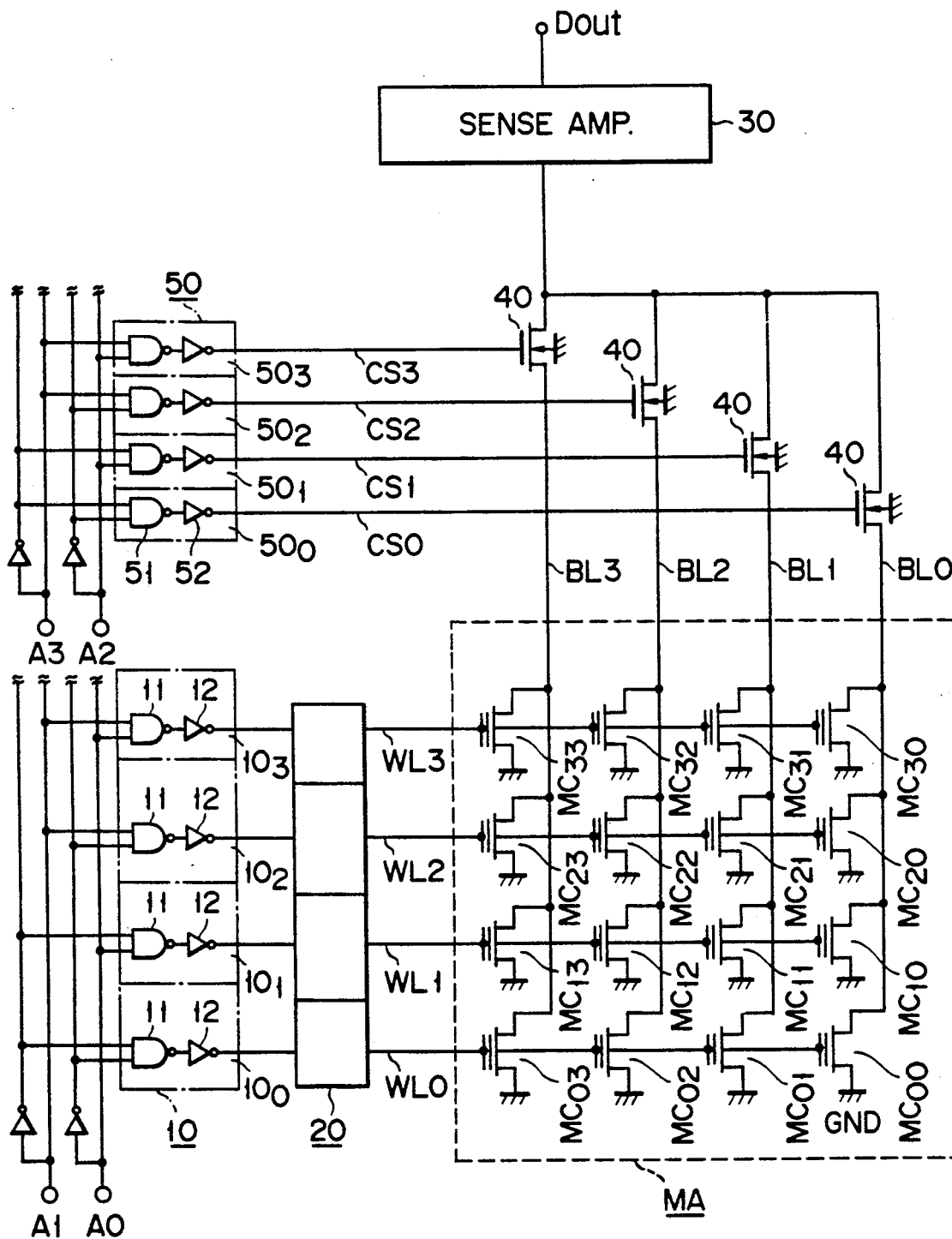
F I G. 1

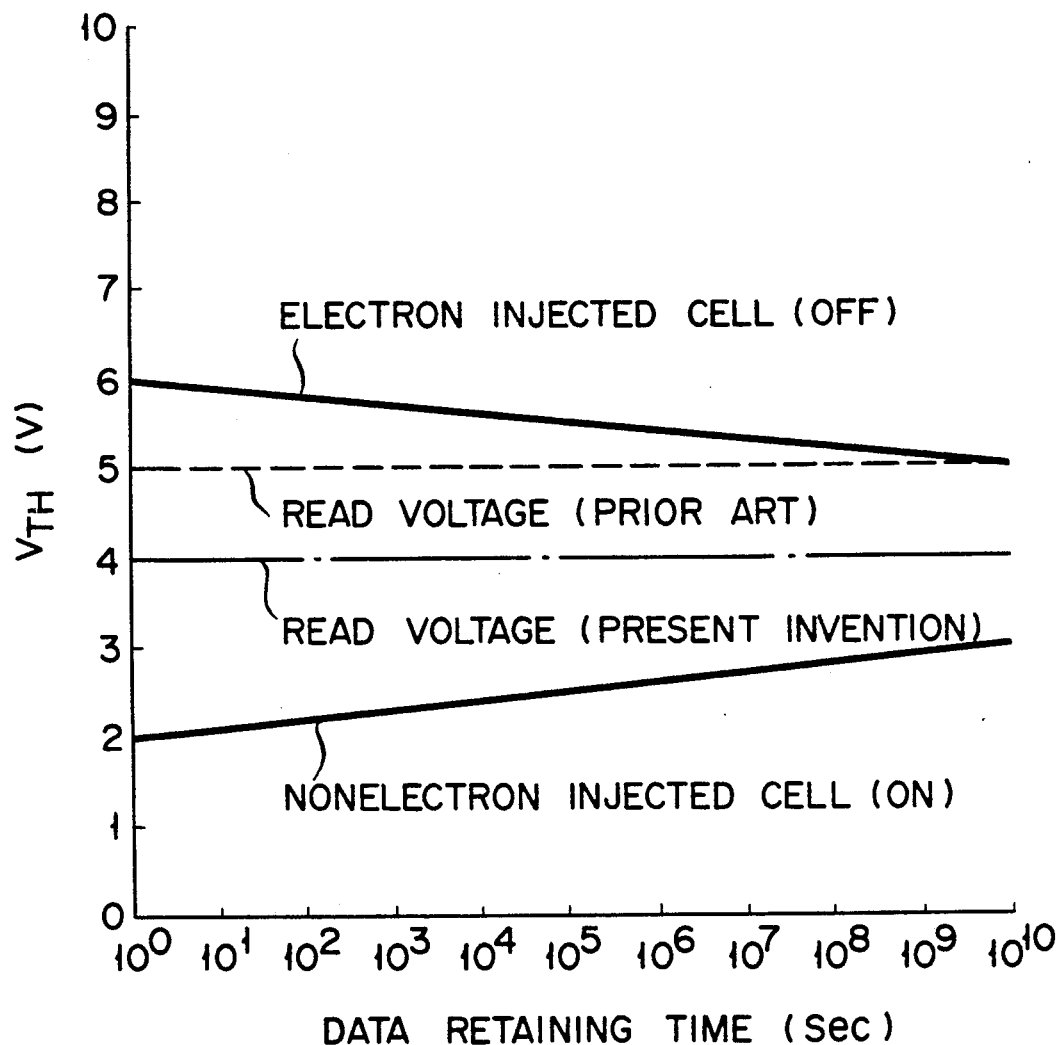
F I G. 2

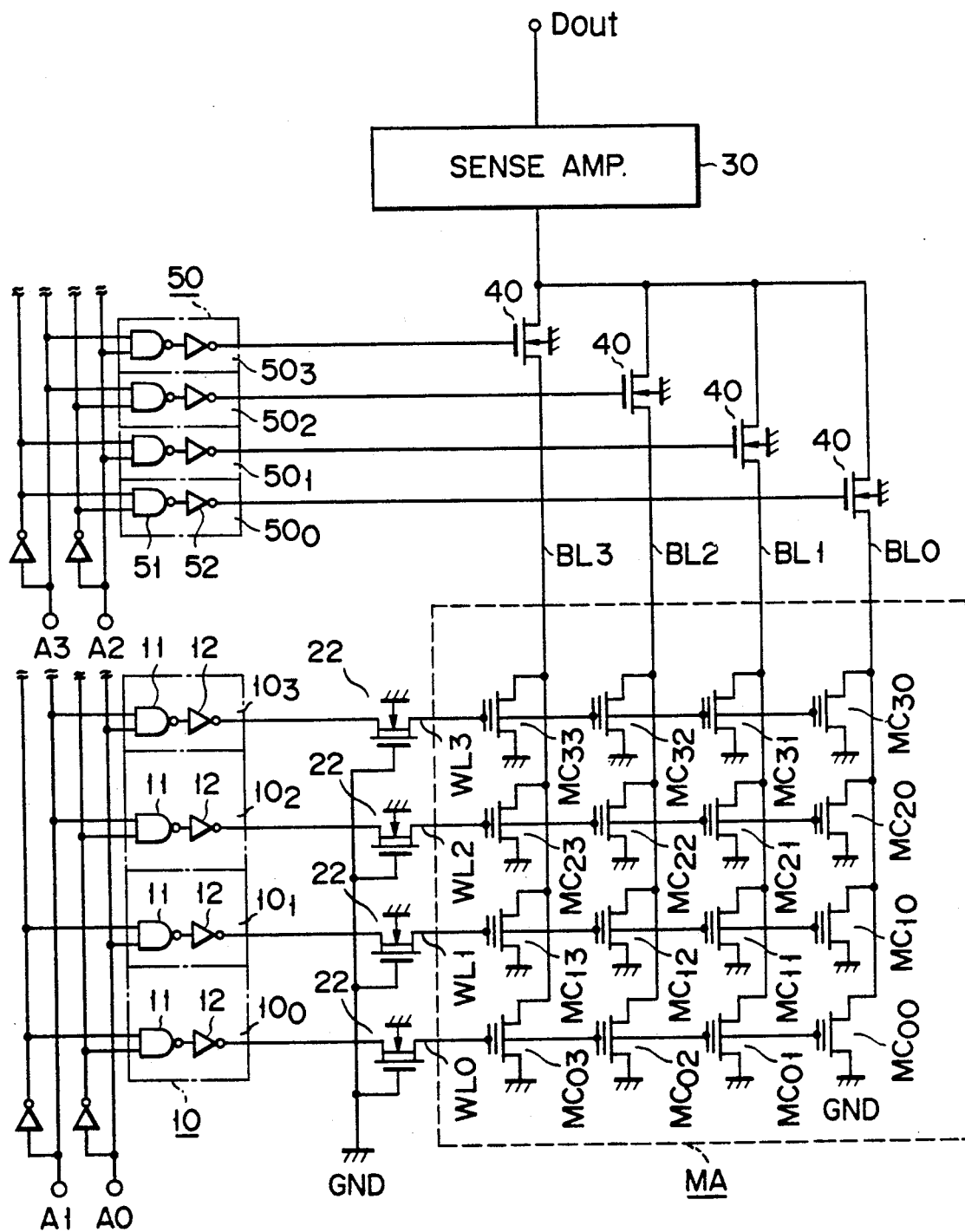
F I G. 5

NONVOLATILE SEMICONDUCTOR MEMORY

BACKGROUND OF THE INVENTION

1. Field of the Invention

The present invention relates to a nonvolatile semiconductor memory using nonvolatile transistors for memory cells, such as an EPROM and an EEPROM.

2. Description of the Related Art

EPROMs and EEPROMs may be enumerated as nonvolatile semiconductor memories using nonvolatile transistors each with the floating gate structure as memory cells. In this type of the nonvolatile semiconductor memory, when a "1" level signal is applied to a word line coupled with the gate of nonvolatile transistor as memory cell, the data programmed in the memory cell is read out onto a bit line coupled with the drain of the transistor, and is applied to a sense amplifier. If the floating gate of the memory cell is in an electron injection state and its threshold voltage $V_{TH}$ is high, this memory cell is apparently in an off state when the "1" level signal is applied to the word line. At this time, a potential on the bit line remains unchanged and the sense amplifier maintains its initial output state. In another condition that the floating gate of the memory cell is in nonelectron injection state and the threshold voltage $V_{TH}$ is in low, the memory cell is apparently in an on state when the "1" level signal is applied to the word line. At this time, the bit line is pulled down by the earth potential and the output of the sense amplifier that has been in the initial state is inverted.

Thus, the sense amplifier is operated depending on whether or not electrons have been injected into the floating gate of the memory cell, that is, whether the threshold voltage of the memory cell is high or low, the sense amplifier is operated and check is made as if the programmed data is "1" or "0". Accordingly, as a difference $\Delta V_{TH}$ of the threshold voltages between the memory cell injected with electrons and the memory cell injected with no electron, becomes larger, an operation margin of the sense amplifier increases.

In an initial state of a general EPROM immediately after data is programmed, the threshold voltage of the nonelectron injected cell is approximately 2 V, and that of the electron injected cell is approximately 6 V. Accordingly, the difference $\Delta V_{TH}$ of the threshold voltages between the electron injected cell and the nonelectron injected cell is approximately 4 V, not large. The difference $\Delta V_{TH}$ decreases as the data retaining time increases.

Normally, the EPROM uses a power source voltage of 5 V for the read voltage, i.e., "1" level signal, to be applied to the gate of the memory cell. This voltage of 5 V is closer to the threshold voltage of the electron injected cell rather than a mid potential between the threshold voltage of the electron injected cell and that of the nonelectron injected cell. Therefore, as the data retaining time is longer, the threshold voltage of the electron injected cell drops up to the read voltage of 5 V, and the electron injected cell which should be in an off state, is turned on mistakenly. This makes it difficult to discriminate an on-state memory cell from an off-state memory cell and vice versa. This greatly reduces an operation margin of the EPROM when it is in a read mode.

As described above, in the conventional nonvolatile semiconductor memory, the read voltage applied to the gate of the memory cell is fixed at the power source voltage irrespective of the threshold voltage of the electron injected cell and the nonelectron injected cell. For this reason, the operation margin of the memory cannot be improved in a read mode.

SUMMARY OF THE INVENTION

Accordingly, an object of the present invention is to provide a nonvolatile semiconductor memory and an EPROM whose operation margins are improved in a read mode.

According to one aspect of the present invention, there is provided a nonvolatile semiconductor memory comprising a memory cell array in which a plurality of memory cells are arrayed in a matrix fashion, each the memory cell including a nonvolatile transistor, a plurality of word lines coupled with the gates of the plurality of memory cells which are arrayed in each row of the memory array, a row decoder including a plurality of partial decoders for selecting the plurality of word lines, a constant voltage output circuit for receiving the outputs of the partial decoders of the row decoder, and for outputting a constant voltage lower than a power source voltage to a corresponding word line of those word lines when the corresponding word line is selected by the partial decoders, a plurality of bit lines coupled with the drains of the plurality of memory cells which are arrayed in each column of the memory array, a column decoder including a plurality of partial decoders for selecting the plurality of bit lines, and a sense amplifier to be coupled with one of the plurality of bit lines selected by an output signal of the column decoder.

According to another aspect of the present invention, there is provided an EPROM comprising a memory cell array in which a plurality of memory cells are arrayed in a matrix fashion, each the memory cell including a nonvolatile transistor, a plurality of word lines coupled with the gates of the plurality of memory cells which are arrayed in each row of the memory array, a row decoder including a plurality of partial decoders for selecting the plurality of word lines, a constant voltage output circuit for receiving the outputs of the partial decoders of the row decoder, and for outputting a constant voltage lower than a power source voltage to a corresponding word line of those word lines when the corresponding word line is selected by the partial decoders, a plurality of bit lines coupled with the drains of the plurality of memory cells which are arrayed in each column of the memory array, a column decoder including a plurality of partial decoders for selecting the plurality of bit lines, and a sense amplifier to be coupled with one of the plurality of bit lines selected by an output signal of the column decoder.

With such an arrangement, in a read mode, a constant voltage lower than the power source voltage is outputted to a word line, so that the gate voltage of the memory cell is set at a mid voltage between the threshold voltage of an electron injected memory cell and that of a nonelectron injected memory cell. Therefore, even if the data retaining time is long and the threshold voltage of the electron injected cell drops, the correct data can be read out from the electron injected cell.

BRIEF DESCRIPTION OF THE DRAWINGS

FIG. 1 is a circuit diagram of an embodiment of a nonvolatile semiconductor memory according to the present invention;

FIG. 2 shows a graphical representation of the data retaining characteristics of a memory cell of an EPROM;

FIG. 5 is a circuit diagram of the nonvolatile semiconductor memory of FIG. 1 when it uses the constant voltage output circuit of FIG. 3;

DETAILED DESCRIPTION OF THE PREFERRED EMBODIMENTS

Figure 3:
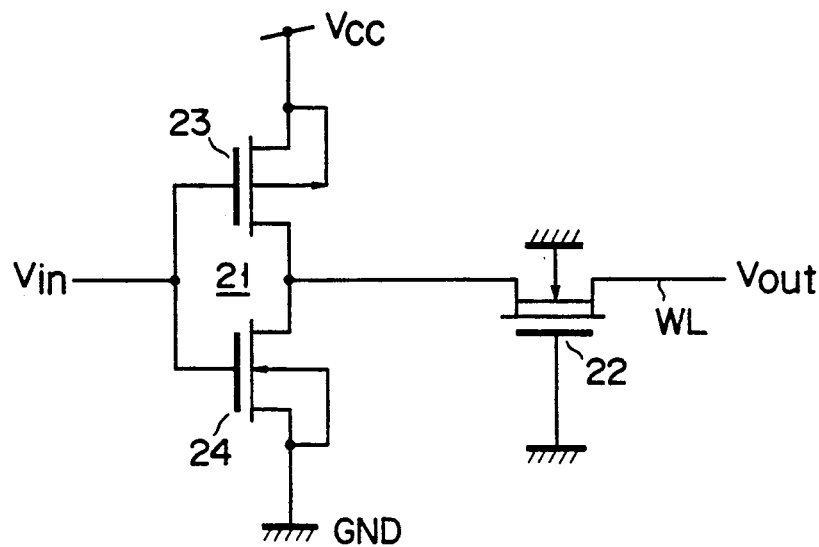
FIG. 3 is a circuit diagram of a constant voltage output circuit used in the semiconductor memory of FIG. 1.

Some specific embodiments of a nonvolatile semiconductor memory according to the present invention will be described with reference to the accompanying drawings.

FIG. 1 is a circuit diagram including a memory cell array and a data read circuit, which are contained in an EPROM according to an embodiment of the present invention. A memory cell array MA substantially has a matrix array of 16 memory cells $MC_{00}$ to $MC_{03}$, $MC_{10}$ to $MC_{13}$, $MC_{20}$ to $MC_{23}$, and $MC_{30}$ to $MC_{33}$. These memory cells are nonvolatile transistors in this instant embodiment. The memory cells arrayed in each row of the matrix array are coupled at the gates with one of four word lines WL0 to WL3. The memory cells arrayed in each column of the matrix array are coupled at the drains with one of four bit lines BL0 to BL3. All of the memory cells in the matrix array are grounded at the sources.

A row decoder 10 receives row address signals of two bits A0 and A1 and the inverted signals, and selectively drives the four word lines WL0 to WL3. The row decoder 10 is provided with four partial decoders $10_0$ to $10_3$. Each partial decoder includes a NAND gate 11 for partially decoding a row address signal and an inverter 12 as a buffer coupled for reception with the output signal of the gate 11. The decoded data signals outputted from the four partial decoders $10_0$ to $10_3$ are respectively coupled with the four word lines WL0 to WL3, through a constant voltage output circuit 20.

The constant voltage output circuit 20 causes the decoded data signals of "1" level outputted from the four partial decoders $10_0$ to $10_3$ to drop below a power source voltage, and applies the the dropped decoded signals to their related word lines.

The four bit lines BL0 to BL3 are coupled with a sense amplifier 30, via MOS transistors 40 for bit line select. These transistors 40 are coupled at the gates with four column select lines CS0 to CS3, respectively.

A column decoder 50 receives column address signals of two bits A2 and A3 and the inverted signals, and selectively drives the four column select lines CS0 to CS3. The column decoder 50 is provided with four partial decoders $50_0$ to $50_3$. Each partial decoder includes a NAND gate 51 for partially decoding a column address signal and an inverter 52 as a buffer coupled for reception with the output signal of the gate 51. The decoded data signals outputted from the four partial decoders $50_0$ to $50_3$ are respectively coupled with the four column select lines CS0 to CS3.

A data retaining characteristic of a memory cell of the cell array MA is as shown in FIG. 2. In an initial state of the EPROM immediately after data is programmed, the threshold voltage of the nonelectron injected cell is approximately 2 V, and that of the electron injected cell is approximately 6 V. As seen from the graph, a difference $\Delta V_{TH}$ between threshold voltages of the electron injected cell and the non-electron injected cell, decreases as the data retaining time increases.

The conventional EPROM uses a power source voltage of 5 V for the read voltage to be applied to the gate of the memory cell. This voltage of 5 V is closer to the threshold voltage of the electron injected cell rather than a mid potential between the threshold voltage of the electron injected cell and that of the nonelectron injected cell. Therefore, as the data retaining time is longer, the threshold voltage of the electron injected cell drops down to the read voltage of 5 V, and the electron injected cell which should be in an off state, is turned on mistakenly. This makes it difficult to discriminate an on-state memory cell from an off-state memory cell and vice versa. This greatly reduces an operation margin of the EPROM when it is in a read mode.

In the semiconductor memory of this instance, the decoded signal of "1" level derived from the row decoder 10 is at 5 V. This figure is the same as in the prior art. It is noted, however, that the constant voltage output circuit 20 receives the 5 V signal and can drop it below 5 V. More exactly, in a read mode of the memory under discussion, the output circuit 20 can set the gate voltage of the memory cell MC at exactly the mid potential between the threshold voltages of the electron injected cell and the nonelectron injected cell, for example, about 4 V as is indicated by a broken line in FIG. 2. This fact implies that even when the data retaining time is longer and the threshold voltage of the electron injected cell drops up to 5 V, for example, correct data can be read out of the electron injected memory cell. As a result, the semiconductor memory of this instance may provide a large operation margin in a read mode.

Turning now to FIG. 3, there is shown a specific circuit arrangement of the constant voltage output circuit 20 which is applicable for the semiconductor memory in the instance. The circuit arrangement is illustrated only with a single word line. As shown, the output circuit 20 is made up of an inverter 21 and an n-channel MOS transistor 22 of the depletion type. The inverter 21 includes a p-channel MOS transistor 23 and an n-channel MOS transistor 24 which are connected in series between a power source voltage $V_{cc}$ of 5 V, for example, and a ground voltage GND. The source-drain path of the transistor 22 is inserted between the output of the inverter 21 and one word line WL. The inverter 21 is coupled for reception with a decoded signal as an input signal $V_{in}$ from a corresponding partial decoder in the row decoder 10. The ground voltage GND is constantly applied to the gate of the transistor 22. The transistors 23 and 24 of the inverter 21 are both of the enhancement type.

With such an arrangement of the constant voltage output circuit, when the voltage $V_{cc}$ of 5 V as the input signal $V_{in}$ is applied to the output circuit, the transistor 23 is turned off, while the transistor 24 is turned on, so that the voltage at the output terminal of the inverter 21 becomes 0 V of the GND. When the input signal $V_{in}$ is the GND of 0 V, the transistor 23 is turned on, while the transistor 24 is turned off, and the output terminal of the inverter 21 is at 5 V of the power source voltage $V_{cc}$. An output signal $V_{out}$ outputted onto the word line WL can be written $$V_{out} = V_{cc} \text{ (where } 0 < V_{cc} < V_{THD} + \Delta V_{THD}) \tag{1}$$

$$V_{out} = V_{THD} + \Delta V_{THD} \text{ (where } V_{THD} + \Delta V_{THD} < V_{cc}) \tag{2}$$

where
$V_{THD}$ = threshold voltage of the depletion type transistor 22, and
$\Delta V_{THD}$ = variation of the threshold voltage due to the back-gate effect of the transistor 22.

Figure 4:
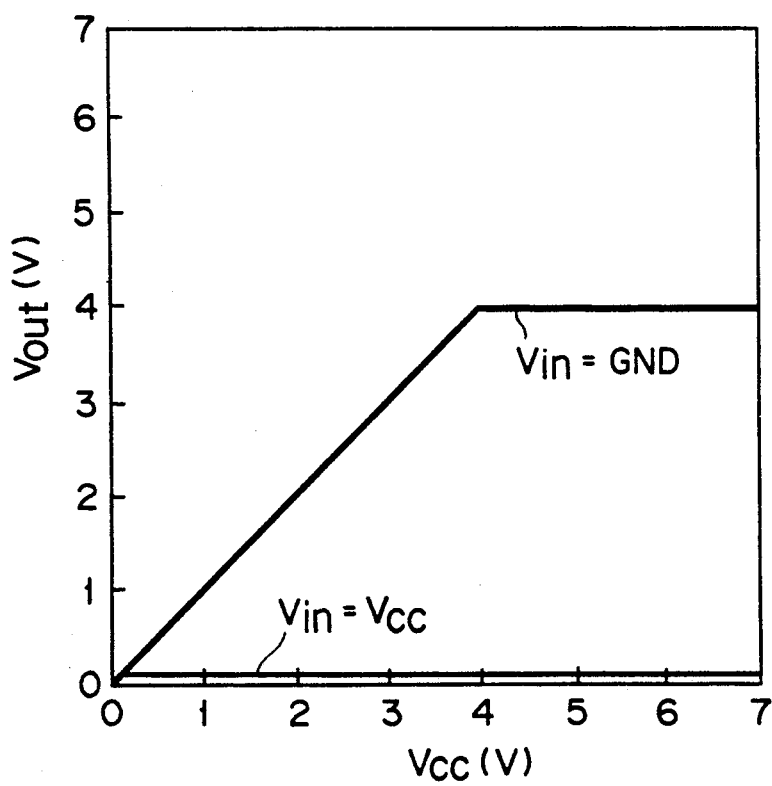
FIG. 4 shows a characteristic of the constant voltage output of FIG. 3.

The constant voltage outputted from the output circuit 20 can readily be set at an appropriate value by merely changing the threshold voltage $V_{THD}$ of the transistor 22 in its manufacturing stage. Assuming that the threshold voltage $V_{THD}$ of the transistor 22 is 4 V and its variation $\Delta V_{THD}$ is 0 V, we have a characteristic curve of the output circuit 20 as shown in FIG. 4. As seen from the figure, even if the input signal $V_{in}$, i.e., the decoded output signal of the row decoder 10, changes between 0 V and 5 V, the output signal $V_{out}$ on the word line WL changes between approximately 4 V and 0 V. It is further seen that even when the power source voltage $V_{cc}$ varies to some degree, the output signal $V_{out}$ is invariable. This implies that the constant voltage output circuit 20 may constantly provide a fixed voltage irrespective of the power source voltage variation.

A specific circuit arrangement of the nonvolatile semiconductor memory of FIG. 1 into which the constant voltage output circuits of FIG. 3 are incorporated, is shown in FIG. 5. In the illustration, the inverter 21 of the output circuit 20 is omitted, because it may be replaced by the inverter 12 as the buffer of each partial decoder $10_0$ to $10_3$ in the row decoder 10.

Figure 6:
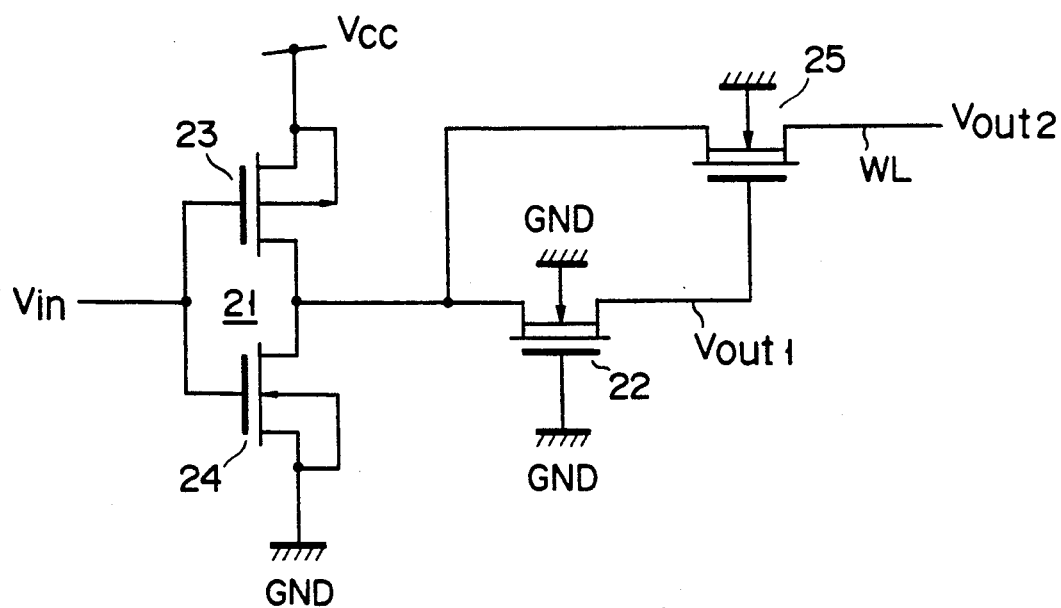
FIG. 6 is a circuit diagram of another constant voltage output circuit used in the memory of FIG. 1.

Another constant voltage output circuit 20 applicable for the semiconductor memory of FIG. 1 is shown in FIG. 6. In this instance, the illustrated circuit concerns only a single word line. The output circuit 20 is made up of an inverter 21, an n-channel MOS transistor 22 of the depletion type, and an n-channel MOS transistor 25 of the depletion type. The inverter 21 includes a p-channel MOS transistor 23 and an n-channel MOS transistor 24 which are connected in series between a power source voltage $V_{cc}$ of 5 V, for example, and a ground voltage GND. The source-drain path of the transistor 22 is connected at one end to the output of the inverter 21. The gate of it is coupled with the ground voltage GND. The source-drain path of the transistor is connected at one end to the output of the inverter 21, and connected at other end to the one word line WL. The gate of it is connected to other end of the source-drain path of the transistor 22. The inverter 21 is coupled for reception with a decoded signal as an input signal $V_{in}$ from a corresponding partial decoder in the row decoder 10.

With such an arrangement of the constant voltage output circuit, when the voltage $V_{cc}$ of 5 V as the input signal $V_{in}$ is applied to the output circuit, the output terminal of the inverter 21 is at 0 V of the GND. When 0 V is supplied, it is at 5 V of the power source voltage $V_{cc}$. An output signal $V_{out1}$ outputted from the other end of the source-drain path of the transistor 22, as in the case of the FIG. 3 circuit, can be written $$V_{out1} = V_{cc} \text{ (where } 0 < V_{cc} < V_{THD} + \Delta V_{THD}) \tag{3}$$

$$V_{out1} = V_{THD} + \Delta V_{THD} \text{ (where } V_{THD} + \Delta V_{THD} < V_{cc}) \tag{4}$$

where
$V_{THD}$ = threshold voltage of each of the transistors 22 and 25, and
$\Delta V_{THD}$ = variation of the threshold voltage due to the back-gate effect of the transistor.

In the above circuit arrangement, since the voltage $V_{out1}$ is coupled with the gate of the transistor 25, a signal $V_{out2}$ outputted onto the word line WL is expressed $$V_{out2} = V_{cc} \text{ (where } 0 < V_{cc} < V_{out1} + V_{THD} < \Delta V_{THD}) \tag{5}$$

$$V_{out2} = V_{out1} + V_{THD} + \Delta V_{THD} \text{ (where } V_{out1} + V_{THD} + \Delta V_{THD} + V_{cc}) \tag{6}$$

Substituting $V_{out1} + V_{THD} + \Delta V_{THD}$ into the relations (5) and (6), we have $$V_{out2} = V_{cc} \text{ (where } 0 < V_{cc} < 2V_{THD} + 2\Delta V_{THD}) \tag{7}$$

$$V_{out2} = 2V_{THD} + 2\Delta V_{THD} \text{ (where } 2V_{THD} + 2\Delta V_{THD} < V_{cc}) \tag{8}$$

Figure 7:
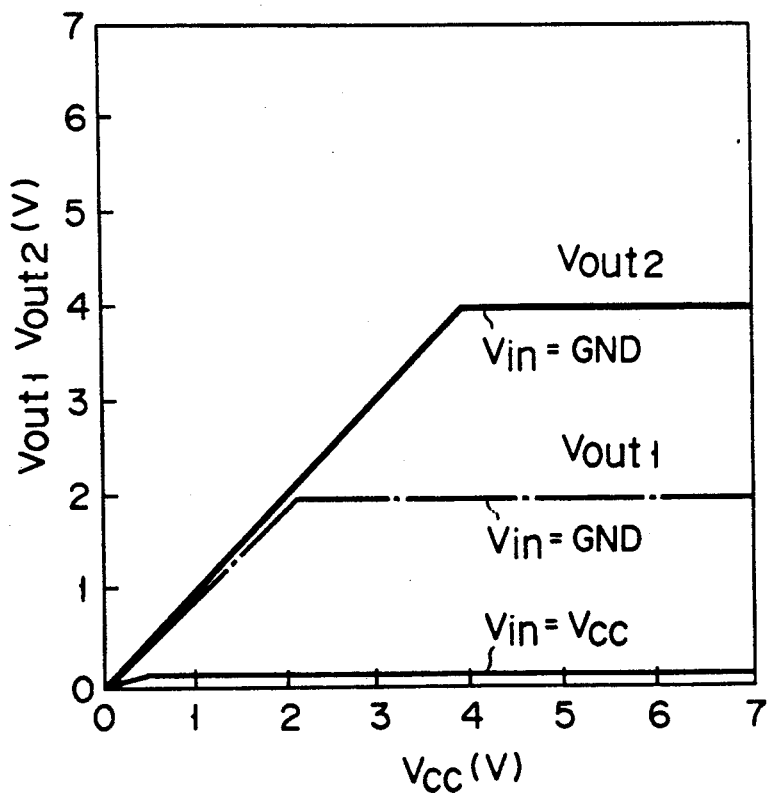
FIG. 7 shows a characteristic of the constant voltage output circuit of FIG. 6.
Figure 8:
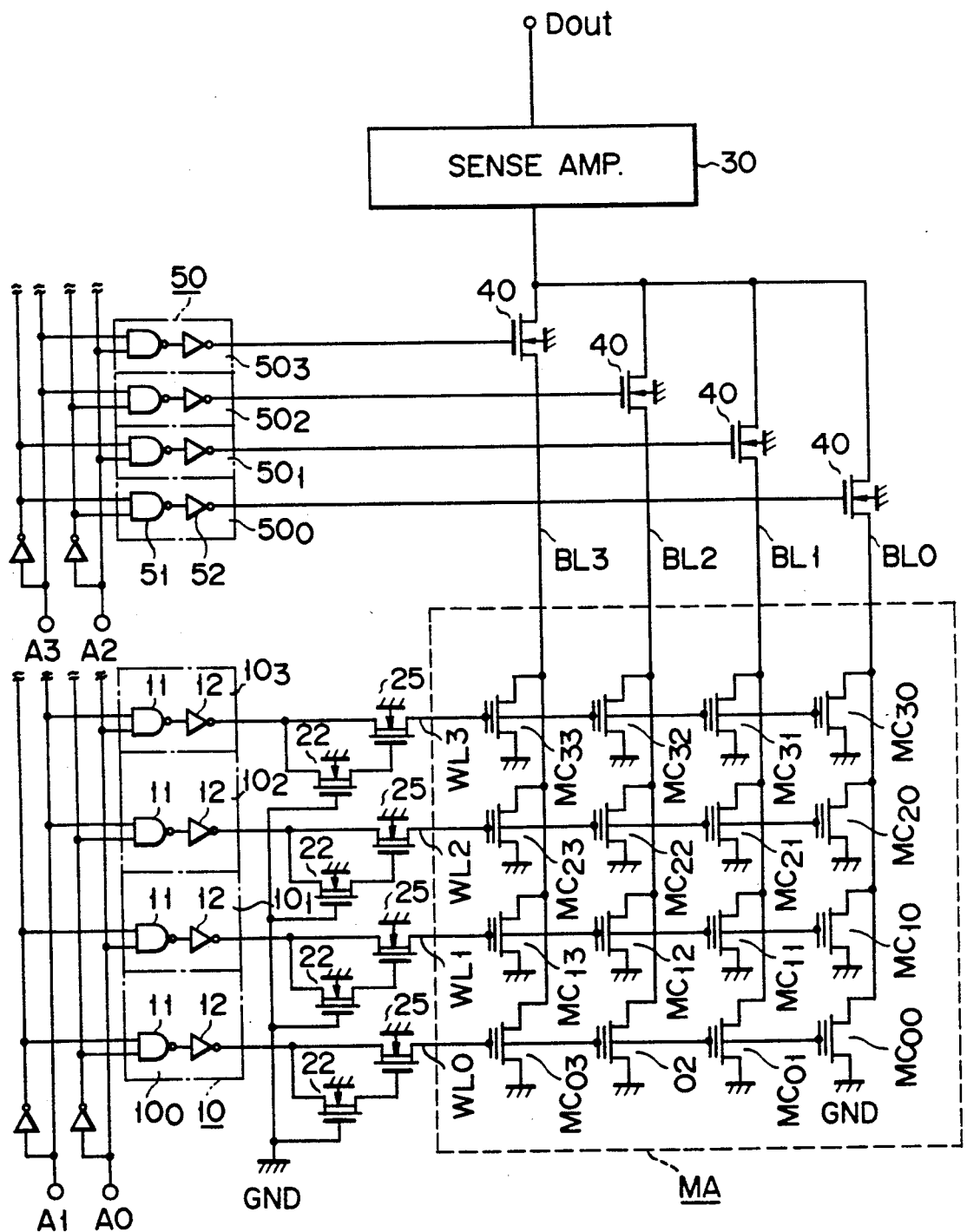
FIG. 8 is a circuit diagram of the nonvolatile semiconductor memory of FIG. 1 when it uses the constant voltage output circuit of FIG. 6.

Assuming that the threshold voltage $V_{THD}$ of each transistor 22 and 25 is 2 V and its variation delta $\Delta V_{THD}$ is 0 V, we have characteristic curves of the output circuit 20 as shown in FIG. 7. As seen from the figure, even if the input signal $V_{in}$, i.e., the decoded output signal of the row decoder 10, changes between 0 V and 5 V, the output signal $V_{out2}$ on the word line WL changes approximately 4 V and 0 V. The 4 V is a mid potential between the threshold voltage of the electron injected cell which the initial threshold voltage is 2 V, and that of the nonelectron injected cell which initial threshold voltage is 6 V. Also in this instance, even when the power source voltage $V_{cc}$ varies to some degree, the output signal $V_{out2}$ is invariable.

A specific circuit arrangement of the nonvolatile semiconductor memory of FIG. 1 into which the constant voltage output circuits of FIG. 6 are incorporated, is of the output circuit 20 is omitted, because it may be replaced by the inverter 12 as the buffer of each partial decoder $10_0$ to $10_3$ in the row decoder 10.

As seen from the foregoing description, the constant voltage output circuits of FIGS. 3 and 6 may each be realized by using three or four MOS transistors for each word line. In an integrated circuit of the semiconductor memory using such a constant voltage output circuit, a little increased chip area is required. The constant voltage outputted from the output circuit 20 can readily be set at an appropriate value by merely changing the threshold voltage $V_{THD}$ of each of the transistors 22 and 25 in its manufacturing stage. Further, since the inverter 21 in the constant voltage output circuit 20 is of the CMOS type, no DC through current flows between the $V_{cc}$ and GND. Accordingly, a little power is consumed by the output circuit 20. Use of the output circuits 20 brings about a little increase of power dissipation in the nonvolatile semiconductor memory.

It should be understood that the present invention is not limited to the above specific embodiments, but it may be variously changed and modified within the scope and spirits of the appended claims. For example, while 0 V of the GND voltage is constantly applied to the gate of the depletion type transistor 22 in the output circuit 20, it may be modified such that 0 V is applied in a read mode, and 12.5 V equal to a write voltage is applied in a write mode. Incidentally, in a write mode, the write voltage must be applied to the word line (gate of the memory cell), it may be straight forwardly applied thereto even if the transistor 22 is provided. It is evident that the present invention is applicable for an EEPROM.

As described above, in a nonvolatile semiconductor memory according to the present invention, a constant voltage output circuit is connected between each word line and the row decoder. By the output circuit, the read voltage applied to the gate of the memory cell is set below the power source voltage. With this feature, a improved operation margin of the memory can be ensured in a read mode.

What is claimed is:

1. A nonvolatile semiconductor memory comprising:
   a memory cell array in which a plurality of memory cells are arrayed in rows and columns in a matrix fashion, each said memory cell including a nonvolatile transistor having a source, gate, and drain, said nonvolatile transistor storing data as a high level or as a low level;
   a plurality of word lines coupled with the gates of said nonvolatile transistors, said plurality of memory cells being arrayed in the rows of said memory array;
   a row decoder including a plurality of partial decoders for selecting one of said plurality of word lines;
   a constant voltage output circuit for receiving the outputs of said partial decoders of said row decoder, and for outputting a constant voltage to said selected one of said plurality of word lines, said constant voltage being a potential substantially halfway between a first and a second threshold voltage that respectively correspond to the high and low levels of the stored data and being used as a voltage for reading the stored data;
   a plurality of bit lines coupled with the drains of said nonvolatile transistors, said plurality of memory cells being arrayed in the columns of said memory array;
   a column decoder including a plurality of partial decoders for selecting one of said plurality of bit lines; and
   a sense amplifier to be coupled with one of said plurality of bit lines selected by an output signal of said column decoder.

2. The nonvolatile semiconductor memory according to claim 1, wherein said constant voltage output circuit includes a plurality of MOS transistors, each said MOS transistor is of the depletion type whose source-drain path is inserted in series between an output terminal of the corresponding partial decoder in said row decoder and the corresponding word line, and whose gate is coupled with a second power source voltage.

3. The nonvolatile semiconductor memory according to claim 2, wherein said second power source voltage is a ground voltage.

4. The nonvolatile semiconductor memory according to claim 2, wherein a threshold voltage of each said MOS transistor is set substantially at a mid potential between a threshold voltage of a nonelectron injected memory cell and that of an electron injected memory cell in an initial stage of said semiconductor memory immediately after data is programmed into each said memory cell.

5. The nonvolatile semiconductor memory according to claim 1, wherein said constant voltage output circuit includes:
   a plurality of first MOS transistors, each said first MOS transistor being of the depletion type whose source-drain path is connected at one end to an output terminal of the corresponding partial decoder in said row decoder, and whose gate is coupled with a second power source voltage; and
   a plurality of second MOS transistors, each said second MOS transistor being of the depletion type whose source-drain path is inserted in series between the output terminal of the corresponding partial decoder in said row decoder and the corresponding word line, and whose gate is coupled with other end of the source-drain path of a corresponding first MOS transistor.

6. The nonvolatile semiconductor memory according to claim 5, wherein said second power source voltage is a ground voltage.

7. The nonvolatile semiconductor memory according to claim 5, wherein a threshold voltage of each said MOS transistor is set substantially at a mid potential between a threshold voltage of a nonelectron injected memory cell and that of an electron injected memory cell in an initial stage of said semiconductor memory immediately after data is programmed into each said memory cell.

8. The nonvolatile semiconductor memory according to claim 1 wherein said nonvolatile semiconductor memory is an EPROM.

* * * * *